(12) United States Patent
Chen et al.

(10) Patent No.: US 6,620,698 B1
(45) Date of Patent: Sep. 16, 2003

(54) METHOD OF MANUFACTURING A FLASH MEMORY

(75) Inventors: Chao-Yang Chen, Kaohsiung (TW); Kent Kuohua Chang, Taipei (TW)

(73) Assignee: Macronix International Co., Ltd., Taiwan (TW)

( * ) Notice: Subject to any disclaimer, the term of this patent is extended or adjusted under 35 U.S.C. 154(b) by 0 days.

(21) Appl. No.: 10/245,588

(22) Filed: Sep. 18, 2002

(51) Int. Cl.[7] .............. H01L 27/108; H01L 29/76; H01L 29/94; H01L 31/119
(52) U.S. Cl. .............. 438/311; 438/257; 438/381
(58) Field of Search .................. 438/197, 257, 438/259, 262, 311, 243, 381, 386, 680, 954, 706

(56) References Cited

U.S. PATENT DOCUMENTS 5,366,915 A * 11/1994 Kodama ............... 438/257
5,783,457 A * 7/1998 Hsu ..................... 438/311
5,936,889 A * 8/1999 Choi .................. 365/185.22

* cited by examiner

Primary Examiner—David Nhu

(57) ABSTRACT

This invention relates to a method for manufacturing a flash memory, more particularly, to the method for manufacturing the contact in a flash memory with buried conductive line. The method uses an ion implantation process to form buried conductive lines under isolation regions such as shallow trench isolations. Then a dielectric layer is formed on the buried conductive line and the contact, whose top is wider than the bottom, is formed in the dielectric layer. At last, a polysilicon layer is formed in the contact to connect with different devices, which are in the different layers. The buried conductive lines connect neighboring active regions and replace conventional contacts and lead lines connecting the active regions. The bottom of the contact and the buried conductive line are connected with each other.

20 Claims, 5 Drawing Sheets

METHOD OF MANUFACTURING A FLASH MEMORY

BACKGROUND OF THE INVENTION

1. Field of the Invention

This invention relates to a method for manufacturing a flash memory, more particularly, to the method for manufacturing the contact in a flash memory with buried line to simplify the steps of the process and to increase the density of the semiconductor devices.

2. Description of the Related Art

Modern semiconductor devices are designed and fabricated toward a trend of size minimization so that more and more devices can be packed in a chip with a limited area. In order to shrink the device sizes of these semiconductor devices and pack these semiconductor devices into one chip as more as possible, various conventional processes of fabricating these semiconductor devices have been improved or even replaced with new processes to overcome many nature limits. Semiconductor devices such as logic devices and memory devices particularly have the necessaries of size decrease and integration increase so that they can operate more powerfully and store more data.

As the density of these semiconductor devices continually increases, the multilevel interconnect structures of these semiconductor devices also has more and more levels. Meanwhile, the problems of the process window decrease and the reducing of planarization are also raised. FIG. 1 shows a cross-sectional diagram of conventional flash memory whose capacitors are not shown. A substrate 100, the first gate 102a, the second gate 102b, a source region 101a, a drain region 101b, a shallow trench isolation (STI) layer 120, interlevel dielectric (ILD) layers 104, a contact 106, an active region 107, a buried conductive line 108, and a metal line 112. The active region 107 is connected to the drain 101b by using the buried conductive line 108 and is used to be a connected point between the traditional contact 106 and the buried conductive line 108. The first gate 102a is formed on the substrate 100 and there is a tunnel dielectric layer 105 between the substrate 100 and the first gate 102a. The second gate 102b is formed on the first gate 102a and there is an oxide/nitride/oxide layer 103 between the first gate 102a and the second gate 102b. The contact 106 is formed in the interlevel dielectric layer 104 and is used to connect to the metal line 112 and the active region 107.

In the traditional flash memory structure, because the active region must be used to be the connected point between the traditional contact and the buried conductive line, a volume of the traditional flash memory is not reduced successfully and the traditional flash memory is formed by using more process steps. This condition will decrease the proceeding efficiency of the traditional flash memory.

In view of the drawbacks mentioned with the prior art process, there is a continued need to develop new and improved processes that overcome the disadvantages associated with prior art processes. The requirements of this invention are that it solves the problems mentioned above.

SUMMARY OF THE INVENTION

It is therefore a main objective of the invention to provide a simplified process of forming contacts and lead lines of semiconductor devices.

The second objective of this invention is to increase the integration and the die density of semiconductor devices and decrease the overhead of the semiconductor devices.

The third objective of this invention is to improve planarization of semiconductor devices and increase process window of the semiconductor devices.

The fourth objective of the invention is to reduce a volume of the semiconductor element.

The further objective of the invention is to increase the proceeding efficiency of the semiconductor element process.

To achieve these objects, and in accordance with the purpose of the invention, the invention uses a method comprising: providing a substrate which comprises the first dielectric layer; forming a trench into the substrate to form a isolation region therein; forming a photoresist layer over the substrate; transferring a line pattern connecting adjacent active regions of the substrate into the photoresist layer to expose the substrate; implanting ions into the substrate at a tilt angle to form a buried conductive line therein; forming the second dielectric layer on the buried conductive line and filling of the trench; forming the first gate on the first dielectric layer and forming a oxide/nitride/oxide layer on the first gate, wherein the first gate is the floating gate of the flash memory; forming a source region and a drain region in the substrate which is on both sides of the first dielectric layer; removing the partial second dielectric layer to form a contact therein, wherein the top of the contact is wider than the bottom of the contact and the bottom of the contact and the buried conductive line are connected with each other; using an ions bombarding to clean the sidewalls and the bottom of the contact; and manufacturing a polysilicon layer in the contact and forming the second gate on the oxide/nitride/oxide layer to finish processes of the flash memory, wherein the second gate the control gate of the flash memory.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The foregoing aspects and many of the attendant advantages of this invention will become more readily appreciated as the same becomes better understood by reference to the following detailed description, when taken in conjunction with the accompanying drawings, wherein:

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1:
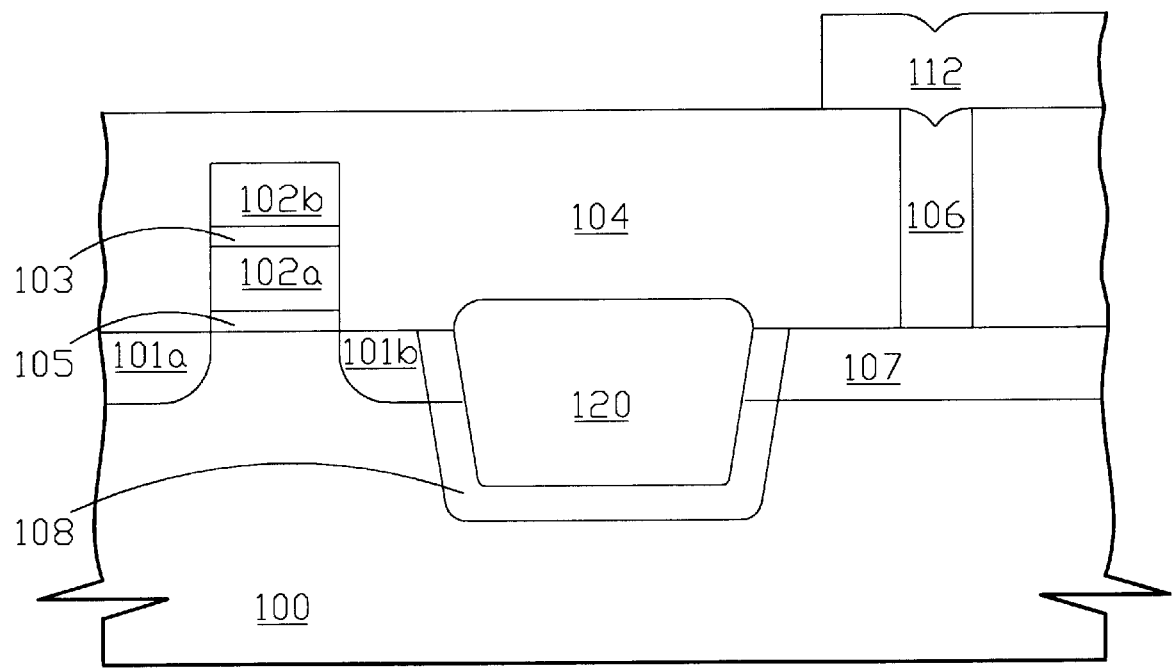
FIG. 1 shows a cross-sectional diagram of a conventional flash memory device.
Figure 2A:
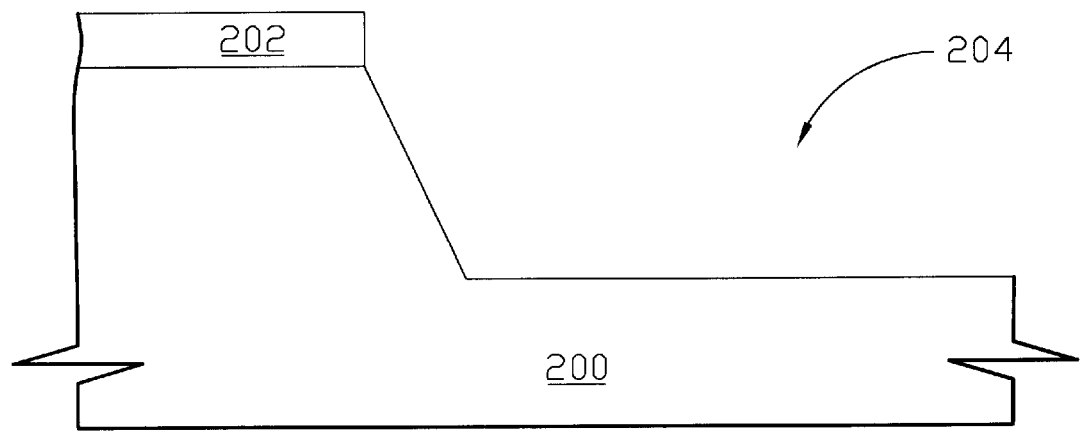
FIG. 2A shows the trench formed in a substrate.

Referring to FIG. 2A, the first dielectric layer 202 is formed over a substrate 200, and the first dielectric layer 202 and the substrate 200 are etched to form a trench 204 therein. The substrate 200 preferably comprises, but is not limited to: a silicon substrate with a <100> crystallographic orientation. The substrate can also comprise other semiconductor substrate such as a silicon on insulator (SOI) substrate, as well as other substrates comprise semiconductive materials such as diamond-like carbon, germanium, gallium arsenide and indium arsenide. The first dielectric layer 202 preferably comprises, but is not limited to: a silicon nitride layer formed by conventional processes such as chemical vapor deposition. The trench 204 is formed by conventional etching methods such as dry etching, and is preferably formed by reactive ion etching. The trench 204 used to form isolation regions such as shallow trench isolations (STI) preferably has a depth of from about 3000 angstrom to about 4000 angstrom. Meanwhile, the region covered by the first dielectric layer 202 is prepared to be used as the active region or the diffusion region of a semiconductor device. The semiconductor device comprises, but is not limited to: memory devices such as dynamic random access memory (DRAM) devices and flash memory devices as well as logic devices such as metal oxide semiconductor (MOS)devices. It is noted that FIG. 2A only shows a portion of the semiconductor devices, other portion of the semiconductor devices is omitted for simplicity.

Figure 2B:
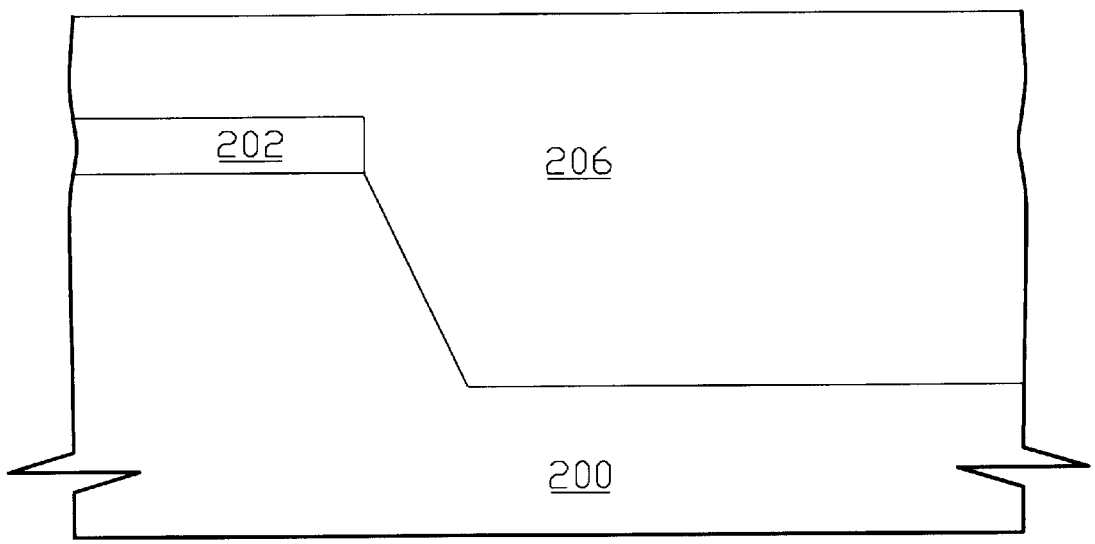
FIG. 2B shows a photoresist layer used as an implantation mask formed over the structure shown in FIG. 2A.
Figure 2C:
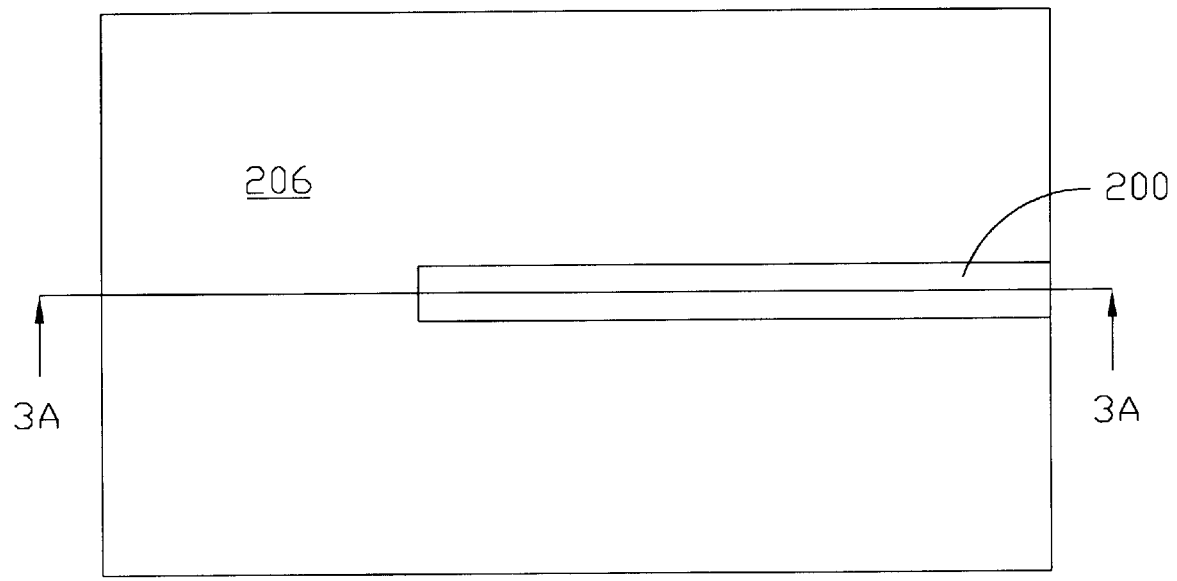
FIG. 2C shows the partial top view of the line pattern.

Referring to FIG. 2B, a photoresist layer 206 used as an implantation mask is formed over the structure shown in FIG. 2A. The photoresist layer 206 can be formed by conventional methods. A line pattern is then transferred into the photoresist layer 206 to expose the substrate. 200 by using conventional photolithography processes. The line pattern connects adjacent active regions and is used to form buried conductive lines in the substrate 200. FIG. 2C shows the partial top view of the line pattern.

Figure 3A:
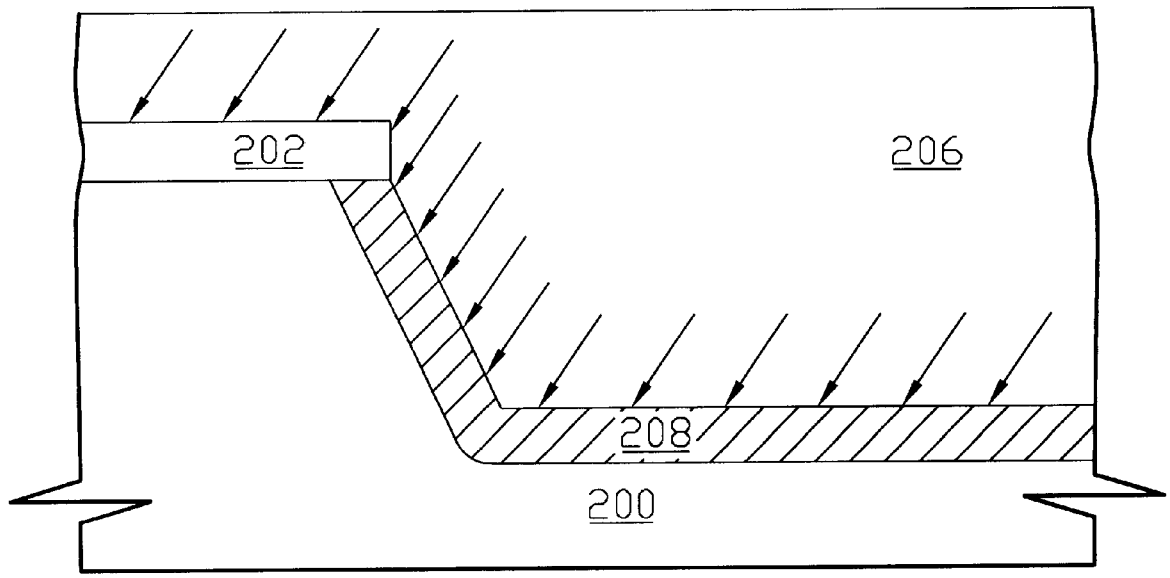
FIG. 3A shows a cross-sectional diagram of the semiconductor device taken along the line I—I shown in FIG. 2C.

FIG. 3A shows a cross-sectional diagram of the semiconductor device taken along the line I—I shown in FIG. 2C. The semiconductor device shown in FIG. 3A is implanted with dopant ions to form a buried conductive line 208 in the substrate 200. The dopant ions comprise, but are not limited to: n-type dopants such as arsenic ions and phosphorus ions. The type of dopant ions implanted depends on demands of various semiconductor devices. For example, if the adjacent active regions connected by the buried conductive line 208 are p-type diffusion regions, the dopant ions should be p-type dopants such as boron ions. The dopant ions are implanted into the substrate 200 with a tilt angle as shown in FIG. 3A. The implantation with a tilt angle is necessary for modern semiconductor devices having high integration. Because the active regions, particularly the diffusion regions, are formed with shallow depth to avoid the shallow channel effect resulting from the increase of the integration. The depth of the diffusion regions is from about 1500 angstrom to about 2500 angstrom. For semiconductor devices having diffusion regions with a deep depth, the tilt angle may not be necessary. For modern semiconductor devices having high integration, the tilt angle is from about 7 degree to about 45 degree and is preferably about 15 degree. The dosage of the dopant ions is from about $1 \times 10^{15}$ $cm^{-2}$ to about $3 \times 10^{15}$ $cm^{-2}$. The thickness or the depth of the buried conductive line 208 is from about 1000 angstrom to about 2500 angstrom.

Figure 3B:
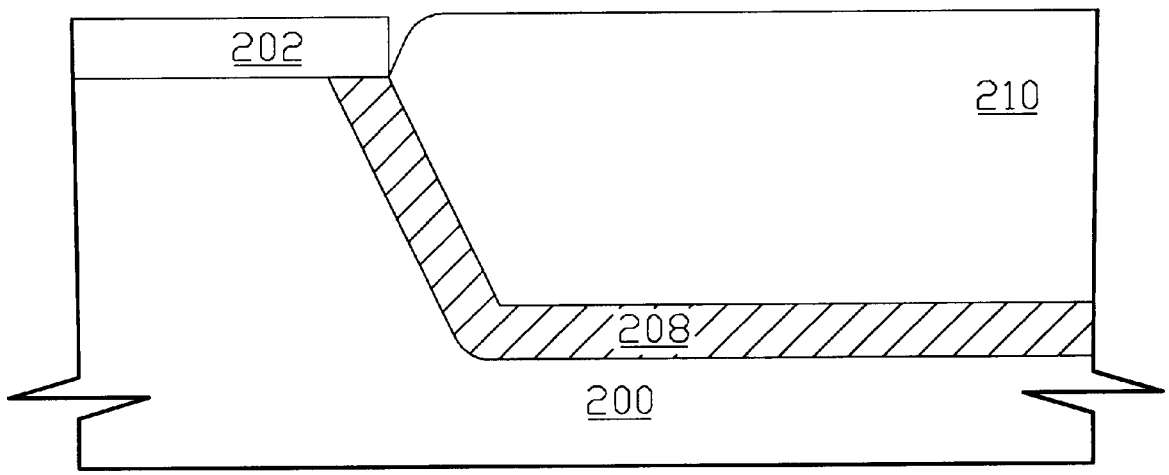
FIG. 3B shows a result of removing the photoresist layer shown in FIG. 3A and filling the trench.

Referring to FIG. 3B, the photoresist layer 206 shown in FIG. 3A is removed by conventional methods and the trench 204 is filled with the second dielectric layer 210 by conventional chemical vapor deposition processes to form a shallow trench isolation. The second dielectric layer 210 preferably comprises, but is not limited to: a silicon dioxide layer. To maintain the conductivity of the buried conductive line 208, the chemical vapor deposition processes preferably comprise high density plasma (HDP) chemical vapor deposition (CVD) process. Chemical vapor deposition processes performed at a relative high temperature such as the low-pressure chemical vapor deposition process should be avoided using.

Figure 3C:
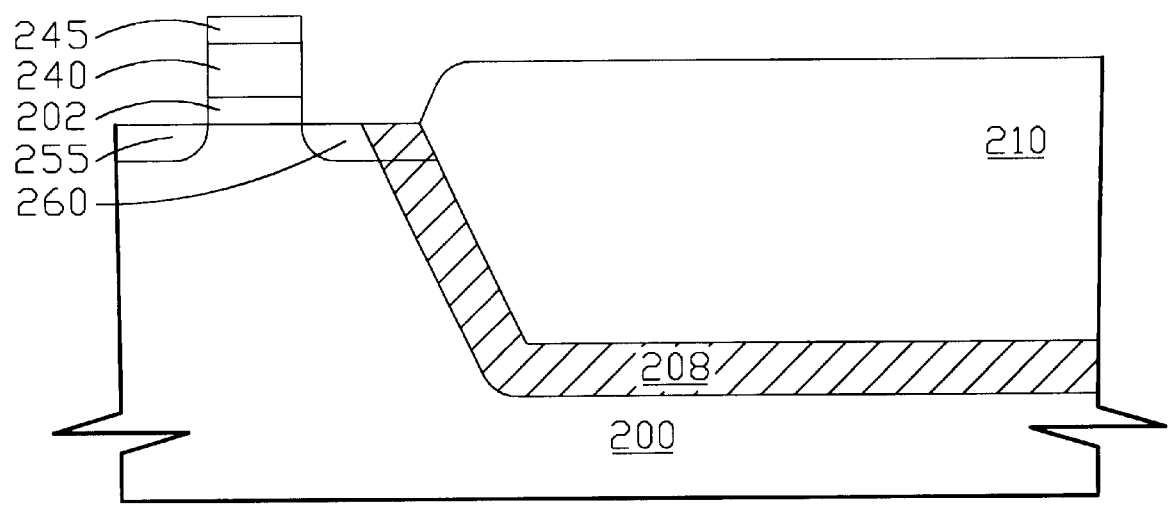
FIG. 3C shows the first gate and the oxide/nitride/oxide layer formed on the first dielectric layer and the source region and the drain region formed in the substrate which is on both sides of the first dielectric layer.

Referring to FIG. 3C, after defining a location of the first gate 240 on the first dielectric layer 202 and removing a part of the first dielectric layer 202, the first gate 240 is formed on the first dielectric layer 202 to be the floating gate, wherein the first dielectric layer 202 is used to be the tunnel dielectric layer. Then an oxide/nitride/oxide layer 245 is formed on the first gate 240 and a source region 255 and a drain region 260 is formed in the substrate which is on both sides of the first dielectric layer 202, wherein the drain region 260 is connected to the buried conductive line 208.

Figure 3D:
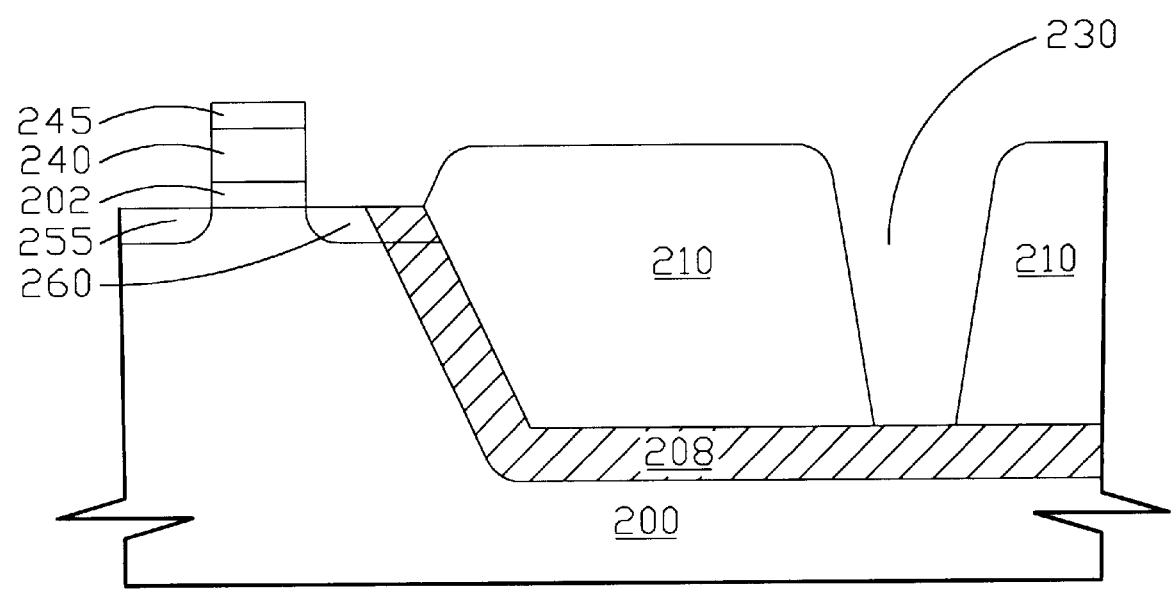
FIG. 3D shows a result of removing the partial second dielectric layer to form the contact therein.

Referring to FIG. 3D, the location of the contact is decided on the second dielectric layer 210, which is in the trench 204. Then the partial second dielectric layer 210 is removed to form a contact 230 in the second dielectric layer 210. The sidewalls of the contact 230 are on a slant and the tilt angle of the sidewall is different following the needs of the process. The tilt angle of the sidewall is usually about 30 degree to 85 degree. Therefore, the top of the contact 230 is usually wider than the bottom of the contact 230. The bottom of the contact 230 and the buried conductive line are connected with each other.

Figure 3E:
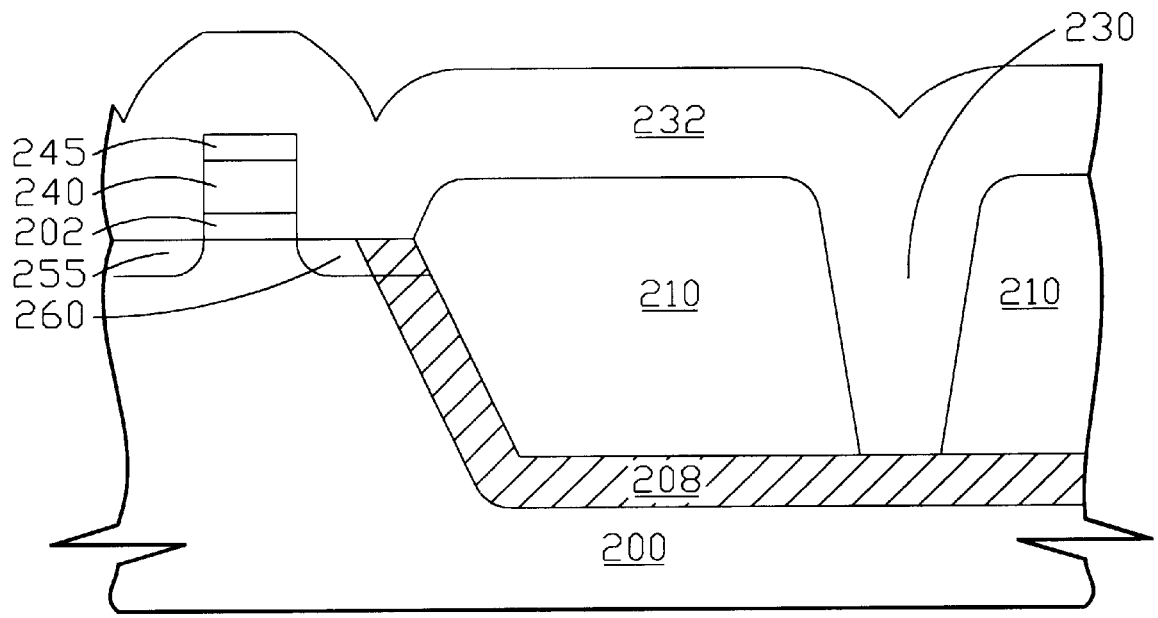
FIG. 3E shows a result of forming a polysilicon layer on the oxide/nitride/oxide layer, substrate, and in the contact and filling of he contact.
Figure 3F:
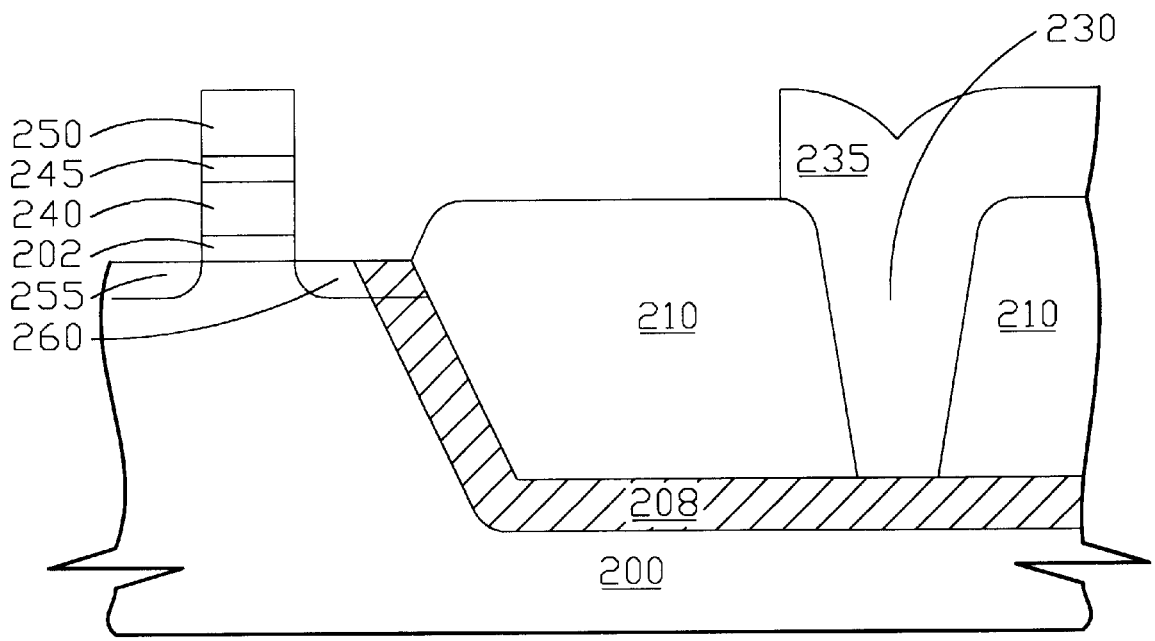
FIG. 3F shows a result of forming a polysilicon layer in the contact and forming the connected region on the contact at the same time.

Referring to FIG. 3E, then a polysilicon layer 232 is formed on the second dielectric layer 210, the oxide/nitride/oxide layer 245 and the substrate 200 and is filled of the contact 230. At last, a part of the second dielectric layer is removed to form the second gate 250 on the oxide/nitride/oxide layer 245 to be the control gate and form a connected region 235 on the contact 230, wherein the connected region 235 is used to contact to others semiconductor elements (referring to FIG. 3F). Before the polysilicon layer 232 is formed in the contact 230, the ions bombarding method is used to bombard the sidewalls and the bottom of the contact 230 at first wherein the ions comprise an argon ions. The objective of the bombarding process is to clean the oxide, which is on the sidewalls and the bottom of the contact 230. The bombarding process can also increase the interface between the contact and the second dielectric layer 210 to reduce the resistance of the flash memory.

After forming the second gate on the oxide/nitride/oxide layer and forming the connected region on the contact window, the process of the flash memory which is formed by using the present invention is finished. Because the contact of the flash memory, which is formed by using the present invention, is formed in the shallow trench isolation layer, a thickness of the flash memory of the present invention can be decreased and the circuit density in the flash memory can be increased. The present invention further fills the polysilicon layer into the contact to form the polysilicon inter connect line to increase process window more effectively.

The method uses an ion implantation with a tilt angle to form buried conductive lines under isolation regions such as shallow trench isolations or embedded in the substrate. The buried conductive lines connect neighboring active regions and replace conventional contacts of the active regions. Then the polysilicon material is filled of the contact, whose sidewalls are on a slant, to be the contact to connected the semiconductor devices, which are in the different layers. The bottom of the contact connects to the buried conductive lines and the top of the contact is wider than the bottom of the contact. Owing to the burying of the conductive lines and the contacts connecting with the buried conductive line, at least one interlevel dielectric layer and conventional contacts can be omitted thereby the process steps needed can be simplified. Moreover, not only the integration and the die density of semiconductor devices can be increased by the omitting of the conventional contacts as well as the decreasing of the overhead of the semiconductor devices, but also the planarization and the process window of semiconductor devices can be effectively upgraded.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of manufacturing a flash memory, said method comprising:

providing a substrate, wherein said substrate comprises a first dielectric layer;

forming a trench into said substrate to form a isolation region therein;

forming a photoresist layer over said substrate;

transferring a line pattern of said substrate into said photoresist layer to expose said substrate and implanting a first ion into said substrate with a tilt angle to form a buried conductive line therein;

removing said photoresist layer;

forming a second dielectric layer on said buried conductive line and filling of said trench;

forming a first gate on said first dielectric layer;

forming an oxide/nitride/oxide layer on said first gate;

forming a source region and a second region in said substrate which is on both sides of said first dielectric layer;

removing said partial second dielectric layer to form a contact therein, wherein a sidewall of said contact is on a slant and a bottom of said contact connects to said buried conductive line;

bombarding said sidewall and said bottom of said contact by using a second ion;

forming a polysilicon layer on said substrate, said oxide/nitride/oxide layer, and in said contact and filling of said contact; and removing said partial polysilicon layer to form a second gate on said oxide/nitride/oxide layer and to form a connected region on said contact.

2. The method according to claim 1, wherein said first ion comprises arsenic ion.

3. The method according to claim 1, wherein said first ion comprises phosphorus ion.

4. The method according to claim 1, wherein said tilt angle is from about 7 degree to about 45 degree.

5. The method according to claim 1, wherein said a tilt angle of said sidewall is about 30 degree to 85 degree.

6. The method according to claim 1, wherein a top of said contact is wider than said bottom of said contact.

7. The method according to claim 1, wherein the dosage of said first ion is from about $1 \times 10^{15}$ cm$^{-2}$ to about $3 \times 10^{15}$ cm$^{-2}$.

8. A method of manufacturing a flash memory, said method comprising:

providing a substrate, wherein said substrate comprises a first dielectric layer;

forming a trench into said substrate to form a isolation region therein by a dry etching process;

forming a photoresist layer over said substrate;

transferring a line pattern of said substrate into said photoresist layer to expose said substrate and implanting a first ion into said substrate with a tilt angle to form buried conductive lines therein;

removing said photoresist layer;

forming a second dielectric layer on said buried conductive line to form a shallow trench isolation layer;

forming a first gate on said first dielectric layer;

forming an oxide/nitride/oxide layer on said first gate;

forming a source region and a second region in said substrate which is on both sides of said first dielectric layer;

removing said partial second dielectric layer to form a contact therein, wherein a top of said contact is wider than a bottom of said contact and said bottom of said contact connects to said buried conductive line;

bombarding said sidewall and said bottom of said contact by using a second ion;

forming a polysilicon layer on said substrate and said oxide/nitride/oxide layer, and in said contact and filling of said contact; and removing said partial polysilicon layer to form a second gate on said oxide/nitride/oxide layer and to form a connected region on said contact.

9. The method according to claim 8, wherein said first ion comprises arsenic ion.

10. The method according to claim 8, wherein said first ion comprises phosphorus ion.

11. The method according to claim 8, wherein said tilt angle is from about 7 degree to about 45 degree.

12. The method according to claim 8, wherein said a tilt angle of a sidewall of said contact is about 30 degree to 85 degree.

13. The method according to claim 8, wherein the dosage of said first ion is from about $1 \times 10^{15}$ cm$^{-2}$ to about $3 \times 10^{15}$ cm$^{-2}$.

14. The method according to claim 8, wherein the thickness of said conductive line is from about 1000 angstrom to about 2500 angstrom.

15. A method of manufacturing a flash memory, said method comprising:

provided a substrate, wherein said substrate comprises a first dielectric layer;

forming a trench into said substrate to form a isolation region therein by a dry etching process;

forming a photoresist layer over said substrate;

transferring a line pattern of said substrate into said photoresist layer to expose said substrates and implanting a first ion into said substrate with a first tilt angle from about 7 degree to about 45 degree to form buried conductive lines therein;

removing said photoresist layer;

forming a second dielectric layer on said buried conductive line to form a shallow trench isolation layer;

forming a first gate on said first dielectric layer to be a floating gate;

forming an oxide/nitride/oxide layer on said first gate;

forming a source region and a second region in said substrate which is on both sides of said first dielectric layer, wherein said drain region is connected to said buried conductive layer;

removing said partial second dielectric layer to form a contact therein, wherein a sidewall of said contact is on a slant with a second tilt angle from 30 degree to 85 degree and a bottom of said contact connects to said buried conductive line;

bombarding said sidewall and said bottom of said contact by using a second ion;

forming a polysilicon layer on said substrate and said oxide/nitride/oxide layer, and in said contact and filling of said contact; and removing said partial polysilicon layer to form a second gate on said oxide/nitride/oxide layer and to form a connected region on said contact, wherein said second is a control gate.

16. The method according to claim 15, wherein said first ion comprises arsenic ion.

17. The method according to claim 15, wherein said first ion comprises phosphorus ion.

18. The method according to claim 15, wherein a top of said contact is wider than said bottom of said contact.

19. The method according to claim 15, wherein the dosage of said first ion is from about $1 \times 10^{15}$ cm$^{-2}$ to about $3 \times 10^{15}$ cm$^{-2}$.

20. The method according to claim 15, wherein the thickness of said conductive line is from about 1000 angstrom to about 2500 angstrom.

* * * * *